(12) United States Patent
Mikalo

(10) Patent No.: US 8,390,453 B2
(45) Date of Patent: Mar. 5, 2013

(54) INTEGRATED CIRCUIT WITH A RECTIFIER ELEMENT

(75) Inventor: Ricardo Mikalo, Heideblick (DE)

(73) Assignee: Qimonda AG, Munich (DE)

( * ) Notice: Subject to any disclaimer, the term of this patent is extended or adjusted under 35 U.S.C. 154(b) by 1191 days.

(21) Appl. No.: 12/241,992

(22) Filed: Sep. 30, 2008

(65) Prior Publication Data

US 2010/0079246 A1 Apr. 1, 2010

(51) Int. Cl.
*G08B 13/14* (2006.01)

(52) U.S. Cl. .................. 340/572.1; 340/16.1; 340/14.61; 438/687

(58) Field of Classification Search ............... 340/572.1, 340/10.1, 16.1, 14.61; 327/564; 257/528, 257/E29.001, E21.476, 499, 762; 438/687, 438/627, 653, 637
See application file for complete search history.

(56) References Cited

U.S. PATENT DOCUMENTS

| 1,640,335 | A | 8/1927 | Grondahl |
| 6,228,767 | B1 * | 5/2001 | Yakura .......................... 438/687 |
| 6,258,702 | B1 * | 7/2001 | Nakagawa et al. ........... 438/570 |
| 6,858,883 | B2 * | 2/2005 | Fricke et al. .................. 257/104 |

* cited by examiner

*Primary Examiner* — Toan N Pham
(74) *Attorney, Agent, or Firm* — Dicke, Billig & Czaja, PLLC

(57) ABSTRACT

An integrated circuit with a rectifier element. One embodiment provides a signal source, an electronic circuit and a rectifier element with a copper layer and a cuprous oxide layer adjacent to and in direct contact with the copper layer. The signal source is configured to drive a signal on a signal output terminal that is electrically coupled to the copper layer. The electronic circuit is electrically coupled to the cuprous oxide layer. The rectifier element may be formed between wiring layers of an integrated circuit.

22 Claims, 9 Drawing Sheets

INTEGRATED CIRCUIT WITH A RECTIFIER ELEMENT

BACKGROUND

In complex integrated circuits, diodes and rectifiers are usually realized as transistors which are wired as diodes. For example, the gate electrode of a field effect transistor may be short-circuited with the source electrode. Realizing diodes as transistors formed in a semiconductor substrate may complicate the application of the diodes because the charge carriers in impurity regions associated to the diodes may interact with neighboring elements or regions in the carrier substrate. Furthermore, such diodes include parasitic elements, for example bipolar junction transistors and further diodes, which influence the device parameters of these diodes making circuit design more difficult.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In one or more embodiment, an integrated circuit as described herein includes a signal source, an electronic circuit, and a rectifier element with a copper layer and a cuprous oxide layer, which is adjacent to and in direct contact with the copper layer. The signal source is configured to drive a signal on a signal output terminal electrically coupled to the copper layer. The electronic circuit is electrically coupled to the cuprous oxide layer.

In one embodiment, a method as described herein provides an integrated circuit. A copper layer may be activated. The activated copper layer is exposed to hydrogen peroxide, wherein a cuprous oxide layer is formed on the copper layer.

Figure 1A:
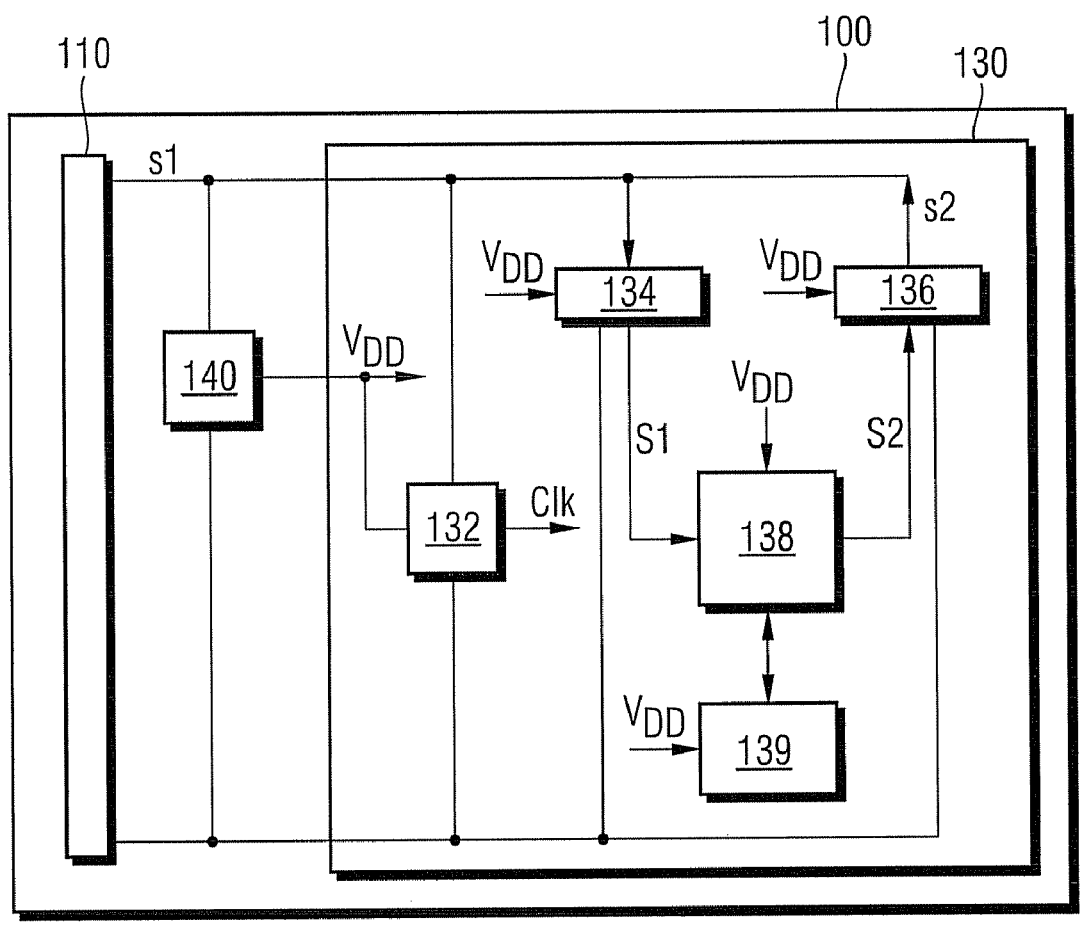
FIG. 1A illustrates a simplified block diagram of a radio frequency tag in accordance with one embodiment.

A radio frequency identification (RFID) tag 100 as illustrated in FIG. 1A includes an antenna element 110, which, in one embodiment of operation, receives an electromagnetic signal with a frequency between about 30 kHz and 3 GHz, for example 125 kHz, 134 kHz or 13.56 MHz. The received signal s1 is an alternating current (AC.) signal. A rectifier and power circuit 140 rectifies the received signal s1 and generates a direct current (DC.) supply signal that may be regulated to provide a DC power supply voltage $V_{DD}$ for an electronic circuit 130. The electronic circuit 130 may include, for example, a demodulator unit 134 which is configured to obtain a rectified binary input signal S1 from the received AC signal s1. The rectified binary input signal S1 may contain a command word for a controller unit 138 and/or memory addresses for a memory unit 139 which may be accessed via the controller unit 138, and/or data which may be written into the memory unit 139 via the controller unit 138. The electronic circuit 130 may include further a modulator unit 136 configured to transform a binary output signal S2 into an AC transmit signal s2, which may superpose the received AC signal s1. The AC transmit signal s2 may be transmitted via the antenna element 110 to a reader station outside the RFID tag.

The RFID tag 100 may further include a clock extraction circuit 132 to generate a clock signal Clk for the controller unit 138 on basis of the received A.C. signal s1. The controller unit 138, the memory unit 139, the demodulator unit 134, the modulator unit 136, and the clock extraction circuit 132 may be integrated on the same carrier substrate forming one integrated circuit. In accordance with further embodiments, the functionality of the electronic circuit 130 may be split up in two or more integrated circuits.

Figure 1B:
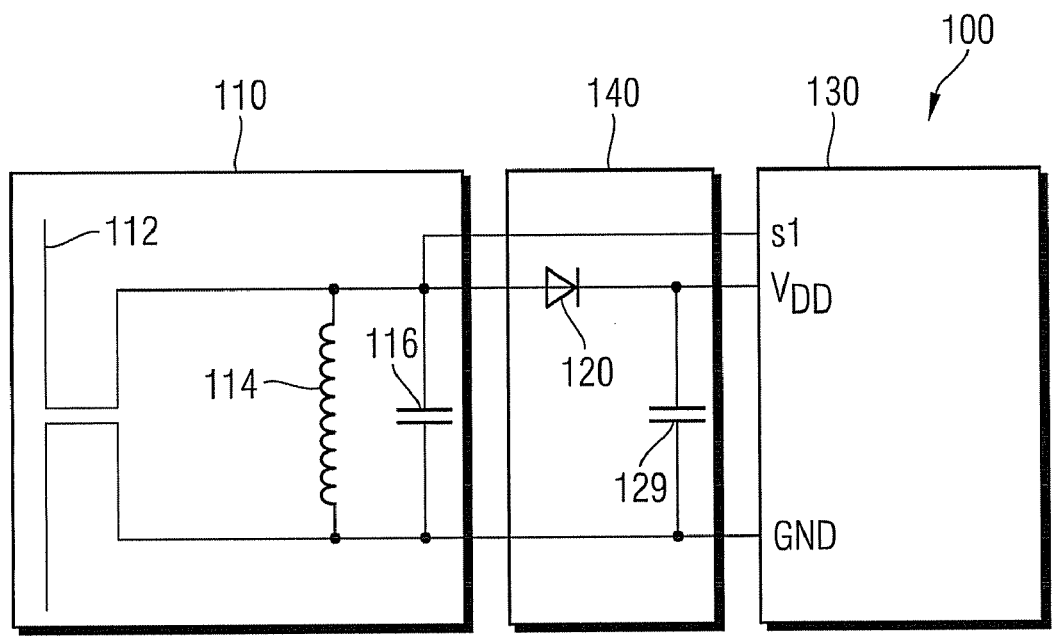
FIG. 1B illustrates a schematic block diagram of a power supply circuit of the radio frequency tag of FIG. 1A.

According to FIG. 1B, the antenna element 110 may include a resonance circuit, for example an LC-oscillator including an inductor 114 and a capacitor 116. The inductor 114 may be a coil. The coil may be realized as a conductive line that forms at least one loop or a planar spiral. The antenna element 110 may be a coil, a planar spiral or a conventional dipole-like antenna, by way of example. The inductor 114 and the capacitor 116 may tune and/or trim the resonant frequency of the antenna element 110.

The rectifier and supply unit 140 may include a rectifier element 120 and a filter capacitor 129 to obtain the DC power supply voltage $V_{DD}$ from the received AC signal s1. In accordance with further embodiments, the rectifier and supply unit 140 may include a voltage regulator and/or a voltage stabilizer.

Figure 1C:
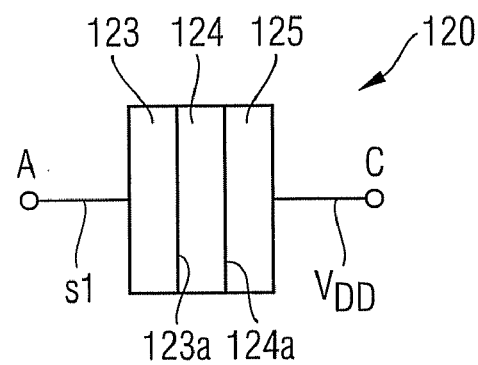
FIG. 1C illustrates schematically a rectifier element according to one embodiment.

As schematically illustrated in FIG. 1C, the rectifier element 120 may include a copper layer 123 and a cuprous oxide (copper (I) oxide, $Cu_2O$) layer 124 which is arranged adjacent to and in direct contact with the copper layer 123. A first interface 123a is formed between the cuprous oxide layer 124 and the copper layer 123. A protective liner 125 may be arranged adjacent to and in direct contact with the cuprous oxide layer 124, wherein a second interface 124a is formed between the protective liner 125 and the copper layer 123. In accordance with an embodiment, a rectifier effect occurs at the first interface 123a, wherein the copper layer 123 is effective as the anode and the cuprous oxide layer 124 is effective as the cathode of the rectifier element 120. In accordance with another embodiment, a rectifier effect may also occur at the second interface 124a in dependence on the material of the protective liner 125.

The rectifier element 120 may be integrated in the wiring layer of a carrier substrate containing, for example, the electronic circuit 130 of FIG. 1B. In accordance with an embodiment, the rectifier element 120 is formed between wiring layers of an integrated circuit that integrates the functionality of the controller unit 138, the memory unit 139, the modulator unit 136 and the demodulator unit 134 of FIG. 1A. The cuprous oxide layer 124 is electrically coupled with a voltage supply input terminal of the electronic circuit 130 of FIG. 1A directly or via the protective liner 125. The copper layer 123 may be electrically coupled with an output terminal of the antenna element 110 of FIG. 1A. Here and in the following, a first terminal is electrically coupled with a second terminal, if a low resistance path is formed between the first and second terminals. The low resistance path may be one conductive line or may include further low-resistive elements, for example contacts, interface layers or forward-biased junctions. The cuprous oxide behaves as a semiconductor. A copper-cuprous oxide-diode shows a significant lower forward voltage drop than equivalent silicon parts. Since the diode is not formed in a semiconducting substrate but between the wiring layers, a parasitic interaction between the diode and electronic elements formed in the semiconductor substrate is significantly reduced.

Figure 1D:
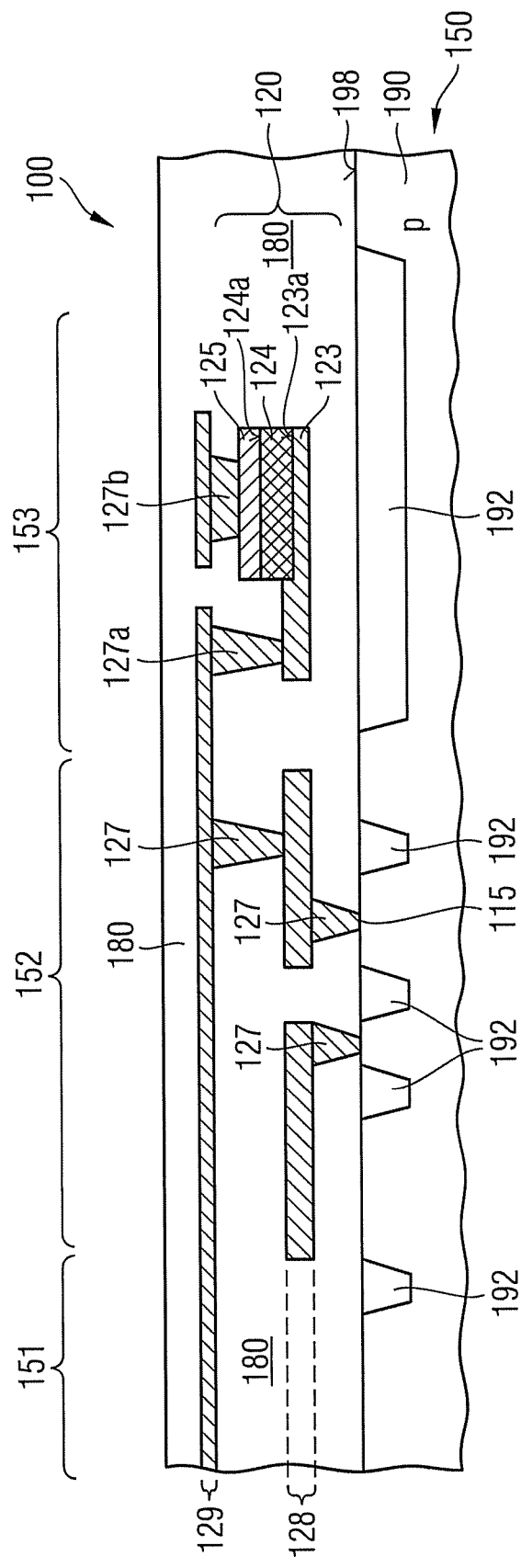
FIG. 1D illustrates a schematic cross-sectional view through a portion of an integrated circuit with wiring layers above a carrier substrate and a rectifier element as illustrated in FIG. 1C in accordance with one embodiment.

FIG. 1D illustrates a portion of a carrier substrate 150 of an integrated circuit 100. The carrier substrate 150 may be, for example, a carrier consisting of or including a flexible plastic, glass, a semiconductor substrate or an organic substrate. According to an embodiment, the carrier substrate 150 may be, for example, a portion of a single crystalline silicon wafer, a SiGe wafer, a A(III)-B(V) wafer, or a silicon-on-insulator (SOI) wafer and may include further doped and undoped sections, epitaxial semiconductor layers as well as further conductive and insulating structures which have previously been fabricated. Dielectric isolation structures 192, for example shallow trench isolations (STIs), may pattern a surface of the carrier substrate 150 and may isolate neighboring electronic devices, for example transistors, diodes, resistors and conductive lines that may be formed at least partially within the carrier substrate 150. Above a main surface 198 of the carrier substrate 150, wiring layers 128, 129 may be formed that are embedded in an inter-level dielectric 180. Contact structures 127 connect conductive lines formed in the wiring layers 128, 129 with electronic devices formed in and on the carrier substrate 150.

Electronic devices in a first portion 151 of the carrier substrate 150 may form an electronic circuit, for example a microprocessor, a microcontroller, a memory cell array, a modulator, a demodulator, a logic circuit or an analog circuit. In accordance with other embodiments, the electronic circuit in the first portion 151 includes an electrically erasable programmable read-only memory (EEPROM). Electronic devices formed in a second portion 152 of the substrate 150 may contain a signal source, which is configured to drive a signal on a signal output terminal 115. The signal source may be an oscillator, a pulse generator or an antenna element, by way of example.

A rectifier element 120 may be arranged in a third portion 153. The first, second and third substrate portions 151, 152, 153 may overlap with each other. In accordance with further embodiments, the third portion 153 may be a sub-section of one of the first or second substrate portions 151, 152. The rectifier element 120 has a copper layer 123 which may be arranged in one of the wiring layers 128, 129. The copper layer 123 may be electrically connected to a signal output terminal 115, for example via contacts 127 and connection lines in the first and second wiring layers 128, 129. A cuprous oxide layer 124 is in direct contact with the copper layer 123. The copper layer 123 and the cuprous oxide layer 124 may form a first interface 123a. A protective layer 125 may be formed above and in direct contact with the cuprous oxide layer 124 along a second interface 124a. The protective layer 124 may be, for example, a thin titanium aluminum, titanium dioxide or titanium zinc layer, which may be formed via a sputter process, respectively. A first contact 127a, which is in direct contact with the copper layer 122, may form an anode terminal and a second contact 127b that may be in direct contact with the protective liner 125 or the cuprous oxide layer 124 may form a cathode terminal of the rectifier element 120. The rectifier element 120 may be embedded completely within the interlayer dielectric 180. The operation of the rectifier element 120 hardly interacts with the operation of electronic devices formed within the carrier substrate 150. Both terminals 127a, 127b are free accessible. Due to the characteristic material properties of cuprous oxide, the rectifier element 120 has a low forward bias voltage. The manufacture of the rectifier element 120 may be integrated in the back-end metallization process of the integrated circuit 100 without increasing process complexity substantially.

Figure 2:
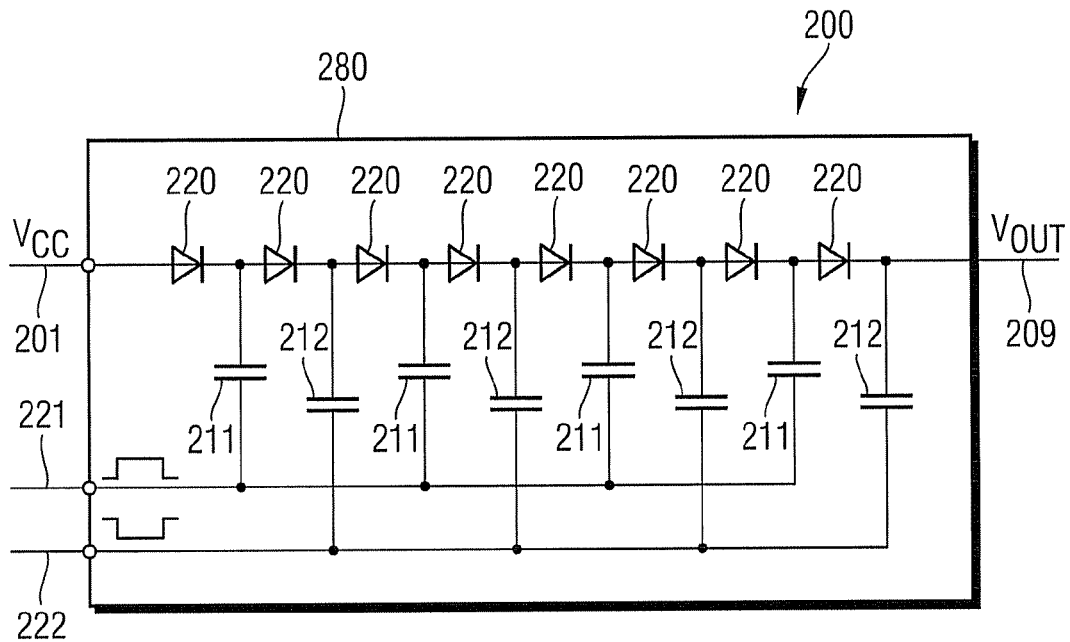
FIG. 2 illustrates a schematic circuit diagram of a charge pump in accordance with one embodiment.

FIG. 2A refers to a charge pump 280 of an integrated circuit 200, wherein the charge pump 280 transforms a low primary voltage $V_{CC}$ applied to an input terminal 201 into a higher secondary voltage $V_{OUT}$ at an output terminal 209. A plurality of rectifier elements 220 may be connected in series to form a rectifier string with the anodes orientated to the input terminal 201 and the cathodes oriented to the output terminal 209. Each network node between two neighboring rectifier elements 220 is connected to a first or a second capacitor 211, 212. The first capacitors 211 may be connected to a first signal line 221 and the second capacitors 212 may be connected to a second signal line 222. The first and second capacitors 211, 212 are connected to the rectifier string in alternating order. A first signal, for example a square pulse, is applied to the first signal line 221. A second signal, which may be the inverted first signal, is applied to the second signal line 222. In alternating order, the first and second capacitors 211, 212 may be charged and recharged for example up to the respective integer multiple of the input voltage $V_{CC}$. A low forward bias voltage of the rectifier elements 220 reduces the time for recharge of the capacitors and increases the efficiency of the charge pump. The rectifier elements 220 may be formed as described with respect to FIGS. 1C and 1D.

Figure 3:
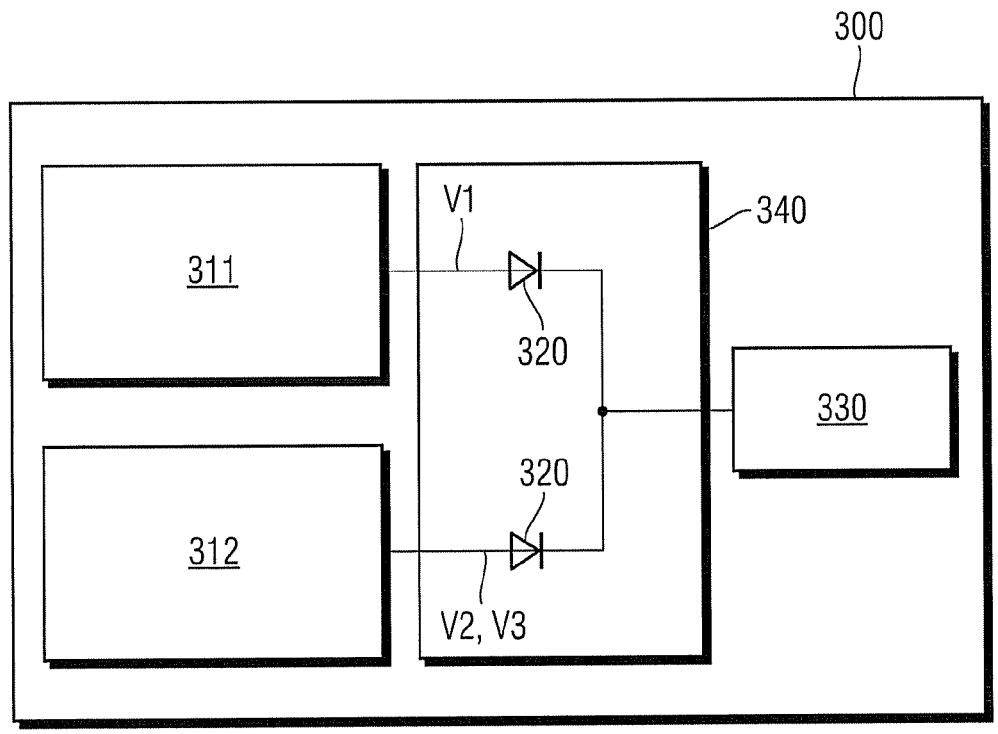
FIG. 3 illustrates a schematic block diagram of an integrated circuit including a supply voltage switch in accordance with one embodiment.

FIG. 3 illustrates a simplified block diagram of an integrated circuit 300 that includes a first supply voltage unit 311 and a second supply voltage unit 312. The first supply voltage unit 311 is configured to supply a low first output voltage V1 of for example 10V. The second supply voltage unit 312 may be configured to temporarily supply a second or a third output voltage V2, V3 wherein the second output voltage V2 is higher than the first output voltage V1, for example 20V, and wherein the third output voltage V3 is lower than the first output voltage V1, for example 0 V. Depending on its operating state, an electronic circuit 330 is supplied either with the first output voltage V1 or with the second output voltage V2.

In accordance with one embodiment, the outputs of the first and second supply voltage units 311, 312 are connected with a supply voltage input terminal of an electronic circuit 330 within the integrated circuit 300 via a voltage switch 340 that includes two rectifier elements 320. Each rectifier element 320 may have a copper layer and a cuprous oxide layer which is in direct contact with the copper layer, wherein the copper layers are electrically coupled to the output terminals of the first and second supply voltage units 311, 312 and wherein the cuprous oxide layers are electrically coupled to each other and via a low ohmic resistance path to the supply voltage input terminal of the electronic circuit 330. Since the voltage drop in the forward biased mode of the rectifier elements 320 is low, the efficiency of the voltage switch 340 is high, whereas the design requirements are relaxed. The voltage switch 340 may be used in processor applications using embedded flash EEPROM-memory cells, by way of example.

Figure 4A:
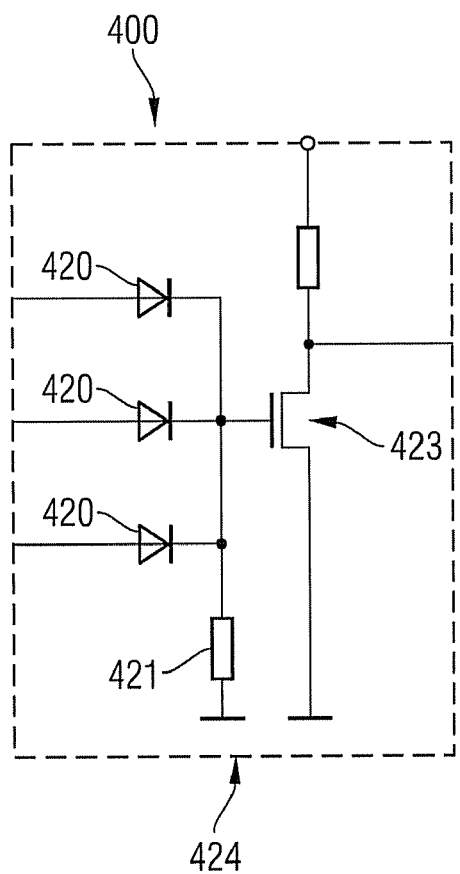
FIG. 4A illustrates a simplified circuit diagram of an OR-element of a diode/transistor-coupled logic circuit in accordance with one embodiment.
Figure 4B:
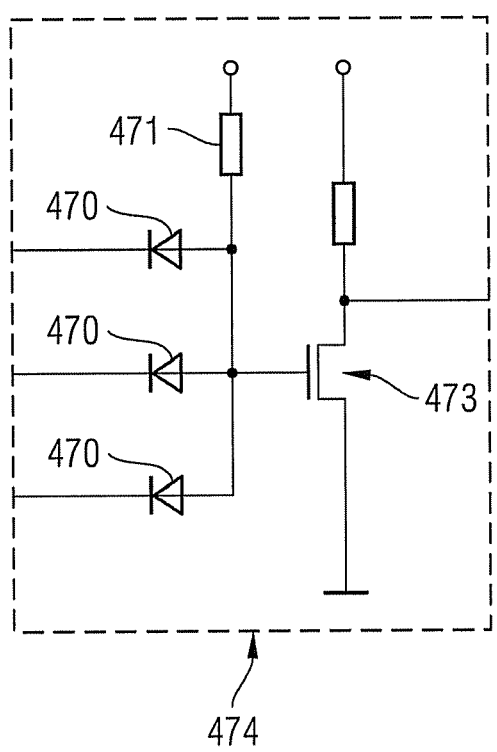
FIG. 4B illustrates a simplified circuit diagram of a NAND-element of a diode/transistor-coupled logic circuit in accordance with one embodiment.

The simplified circuit diagrams of FIGS. 4A and 4B refer to the use of rectifier elements 420, 470 in a diode/transistor-coupled logic circuit, wherein the diodes may be realized completely in the inter-level dielectric of an integrated circuit 400.

According to FIG. 4A, at least two, for example three rectifier elements 420 are connected to each other at the cathode side. A pull-down resistor 421 pulls down the output voltage on the cathode side to the low supply voltage in an all-reverse-biased state. The signal on the cathode side may control a field effect transistor that inverts and recovers a logic signal to form a NOR-gate 424.

The rectifier elements 470 of FIG. 4B are connected on the anode side, which is pulled up to the positive supply voltage via a pull-up resistor 471 in an all-reverse-biased state. The signal on the anode side may be electrically coupled to the gate terminal of a field effect transistor 473 to form a NAND-gate 474. By realizing the rectifier elements 420, 470 completely in the inter-level dielectric the forward biased state of the diodes 420, 470 has less effect on the operation of electronic devices formed within a carrier substrate below the inter-level dielectric.

Figure 5A:
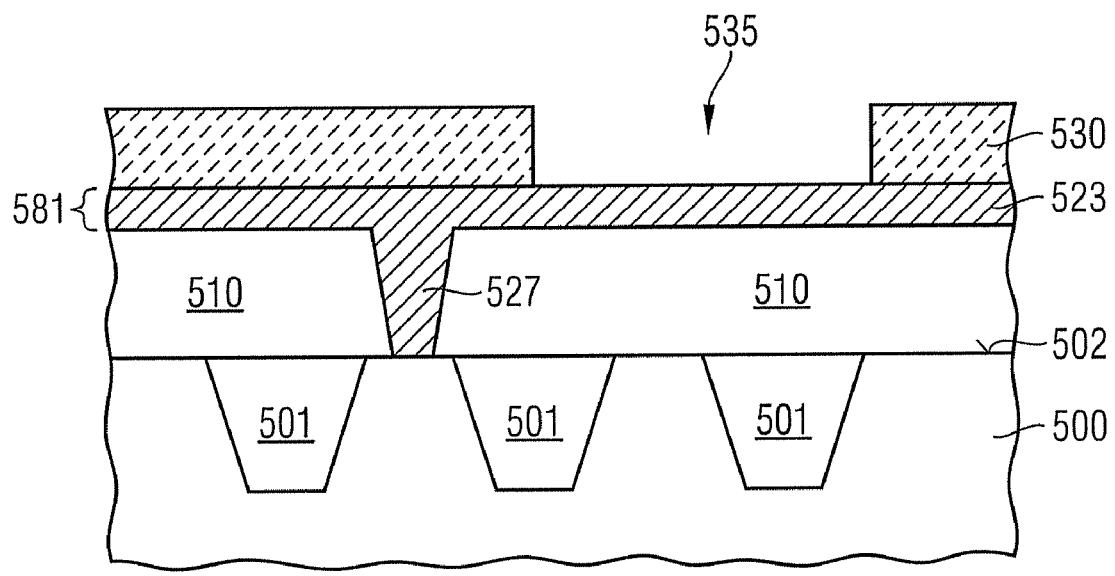
FIG. 5A illustrates a cross-sectional view of a substrate portion with a patterned hard mask over a copper wiring layer for illustrating a method of forming an integrated circuit with a rectifier element in accordance with one embodiment referring to a masked formation of a cuprous oxide layer.
Figure 5B:
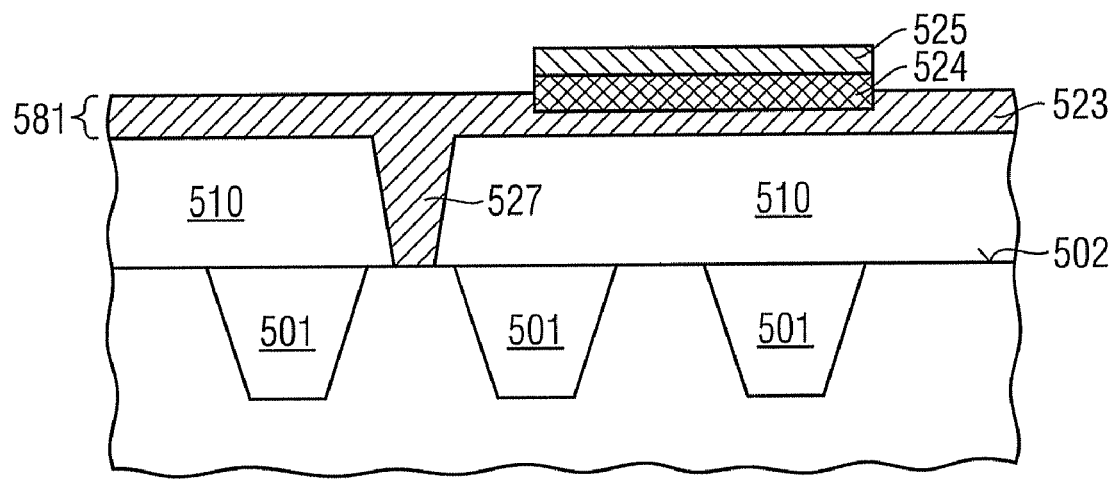
FIG. 5B illustrates a simplified cross-sectional view of the substrate portion of FIG. 5A after removing the hard mask.
Figure 5C:
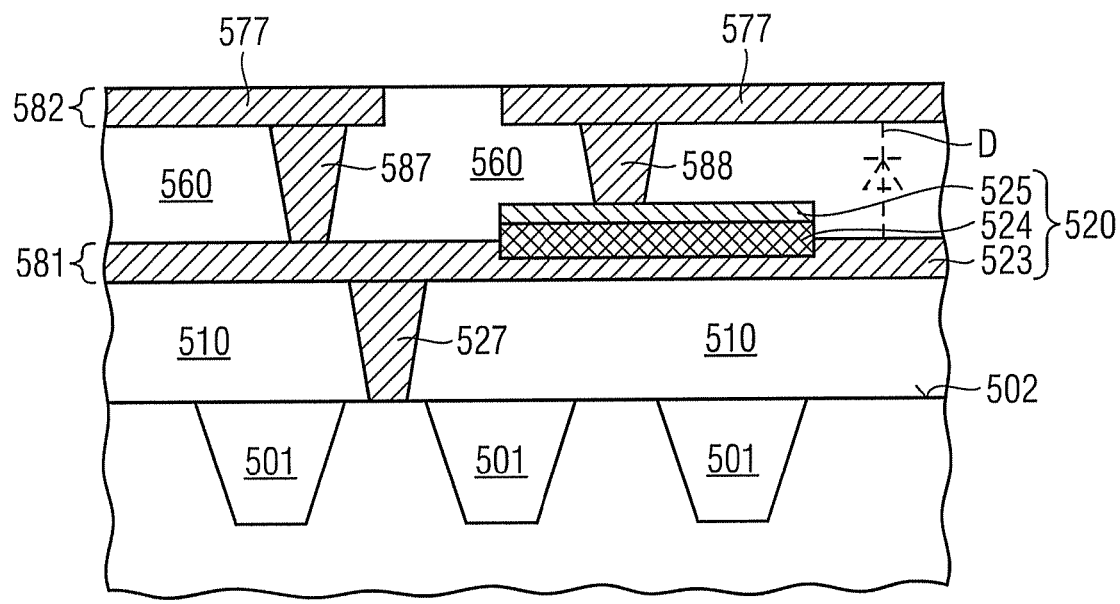
FIG. 5C illustrates a simplified cross-sectional view of the substrate portion of FIG. 5B after forming a further wiring layer.

FIGS. 5A to 5C refer to a method of manufacturing an integrated circuit, wherein the integrated circuit may be, for example, an RFID transponder or tag or an integrated circuit with EEPROM cells by way of example.

In a carrier substrate 500, electronic devices like field effect transistors, bipolar transistors, diodes, resistors, connection lines and others may be formed. Dielectric isolation structures 501 may isolate neighboring electronic devices within the carrier substrate 500. A first interlayer dielectric 510 may be deposited onto a main surface 502 of the carrier substrate 500 and may be a doped or undoped silicon oxide or silicon dioxide, for example a boron phosphorous doped silica glass. For example via damascene techniques, contact structures 527 and connection lines 523 may be formed in a first wiring layer 581. The contacts 527 and the connection lines 523 may be formed from the same material or from different materials. The connection lines 523 may be made of copper and may form a copper structure. A heat-resistant hard mask 530 may be formed above the connection lines 523 and the interlayer dielectric 510. The hard mask 530 may be made of silicon nitride $Si_3N_4$, silicon dioxide $SiO_2$, carbon, amorphous silicon or polycrystalline silicon, by way of example. The hard mask 530 is patterned such that openings 535 uncover (expose) first connection line portions, in which rectifier elements are formed in the following, whereas the hard mask 530 may cover further connection line portions.

According to FIG. 5B, the uncovered first portions of the connection lines 523 may be activated. For example, the carrier substrate 500 or at least the connection lines 523 are heated up to at least 250 degree Celsius, for example to at least 300 degree Celsius. In accordance with other embodiments, the connection lines may be activated by exposing them to a suitable fluid with or without a contemporaneous or a following anneal. For example, the connection lines 523 may be activated by an etch using ammonium persulfate $(NH_4)_2S_2O_8$ and an anneal at 150 degree Celsius. The activated uncovered first portions of the connection lines 523 are exposed to hydrogen peroxide, wherein a cuprous oxide layer 524 is formed on the exposed copper surfaces, and wherein the copper is consumed in part. Then a protective liner 525 may be deposited on the cuprous oxide layer 524 and the hard mask 530. The hard mask 530 is removed, wherein portions of the protective liner 525 deposited above the hard mask 530 may be lifted off.

According to FIG. 5C, a second interlayer dielectric 560, for example a doped or undoped silica glass, may be deposited on the first wiring layer 581. Further contacts 587, 588 and further connection lines 577 in a second wiring layer 582 may be formed and may connect the cathode side of the rectifier element 520 to an electric circuit formed in or above the carrier substrate 500. The rectifier element 520 includes a copper layer 523, a cuprous oxide layer 524 and may have a protective liner 525 and forms a diode D between connection lines in the wiring layers 581, 582. In accordance with other embodiments, the protective liner 525 may be omitted.

Figure 6A:
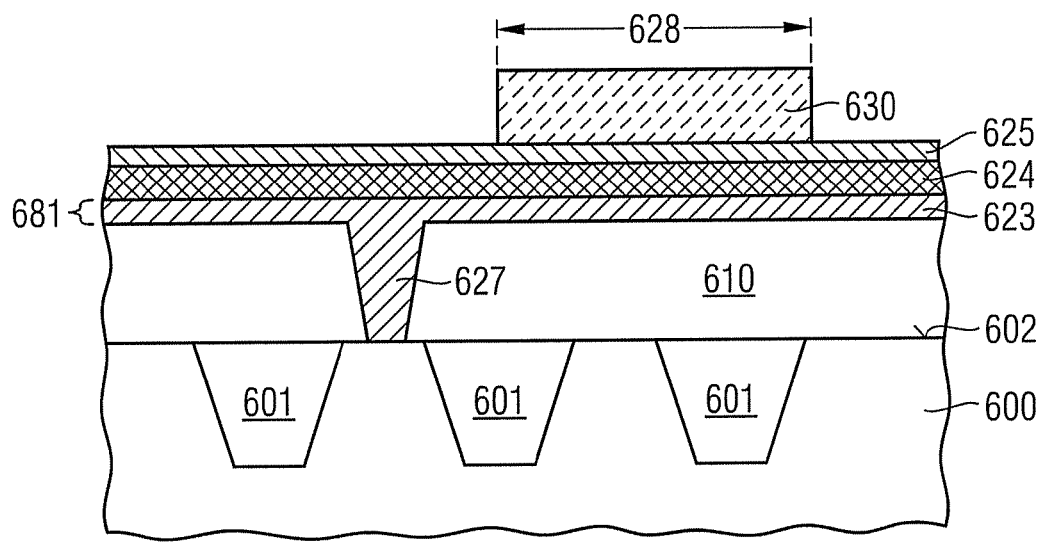
FIG. 6A illustrates a simplified cross-sectional view of a substrate portion including a patterned hard mask over a copper wiring layer for illustrating a method of forming an integrated circuit with a rectifier element in accordance with one embodiment referring to a masked etch of a cuprous oxide layer.
Figure 6B:
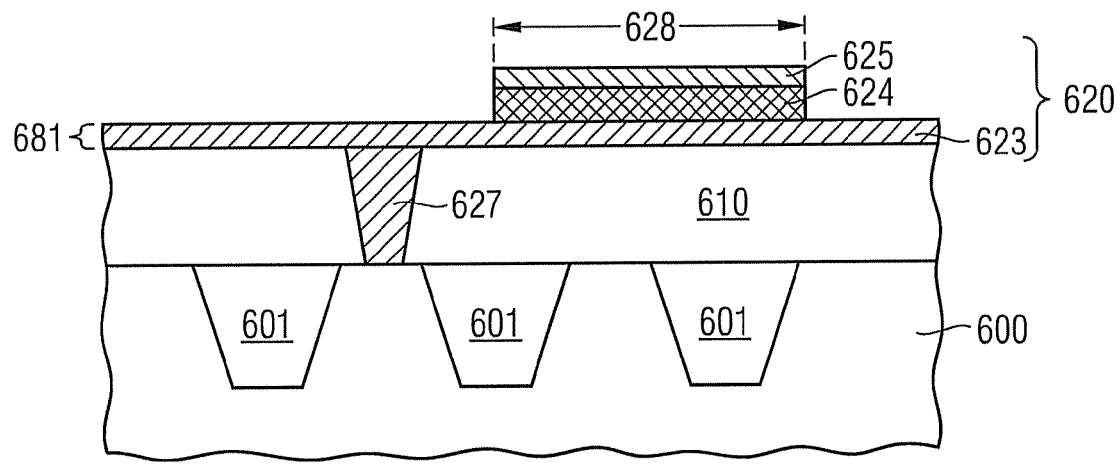
FIG. 6B illustrates a simplified cross-sectional view of the substrate section of FIG. 6A after removing the hard mask.

FIGS. 6A to 6B refer to a further method of manufacturing an integrated circuit, for example an RFID tag or an integrated circuit with EEPROM cells. Dielectric isolation structures 601, for example STIs, isolate neighboring electronic devices formed within a carrier substrate 600. A first interlayer dielectric 610 is disposed above a main surface 602 of the carrier substrate 600. In a first wiring layer 681, connection lines 623 may be formed on the first interlayer dielectric 610. The connection lines 623 may be copper structures. Contact structures 627 may connect the electronic devices in the carrier substrate 600 with the connection lines 623. The carrier substrate 600 is activated, for example heated up to at least 250 degrees Celsius, for example to at least 300 degrees Celsius. In accordance with other embodiments, applying a suitable fluid with or without a contemporaneous or a following anneal may activate the connection lines 623. For example, the connection lines 623 may be activated by an etch using ammonium persulfate $(NH_4)_2S_2O_8$ and an anneal at 150 degree Celsius. The activated carrier substrate 600 including the copper connection lines 623 is exposed to hydrogen peroxide, wherein a cuprous oxide layer 624 is formed on the exposed copper surfaces. A protective liner 625, for example titanium aluminum or a titanium dioxide layer may be deposited on the cuprous oxide layer 624. A hard mask layer may be deposited above the cuprous oxide layer 624, for example directly on the cuprous oxide layer 624 or on the protective layer 625. The hard mask layer is patterned such that remnant portions of the hard mask layer form a hard mask 630 covering diode regions 628, in which diodes are formed. Pad-like widened sections and/or extension of the respective connection line 623 may increase the area of the diode regions 628.

According to FIG. 6B the hard mask 630 may be used as an etch mask to remove portions of the cuprous oxide layer 624 and protective layer 625 outside the diode regions 628. In the diode regions 628, non-consumed portions of the connection line 623 and the cuprous oxide layer 624 form a rectifier element 620. The back-end metallization process may proceed as described with regard to FIG. 5C.

Figure 7:
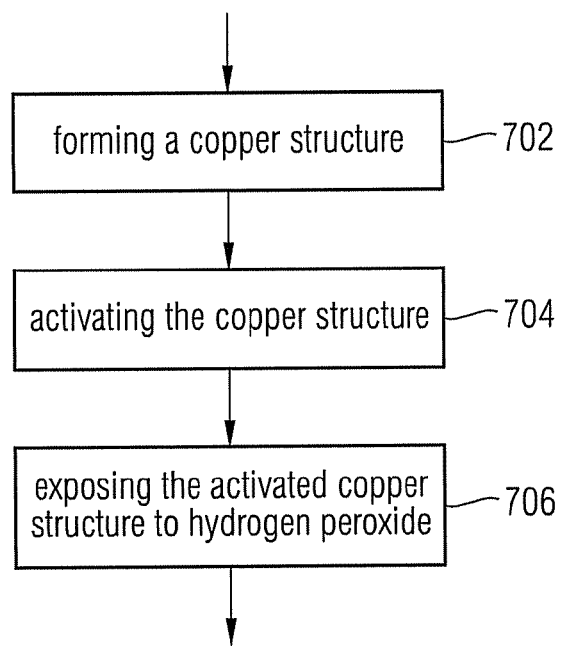
FIG. 7 is a simplified flow chart illustrating a method of manufacturing an integrated circuit with a rectifier element according to one embodiment.

FIG. 7 refers to a method of manufacturing an integrated circuit that includes a rectifier element. A copper structure, for example a portion of a connection line in a metallization or wiring layer may be formed (702). The copper structure is activated, for example heated up to at least 250 degree Celsius (704). The activated copper structure is exposed to hydrogen peroxide, wherein a cuprous oxide layer is formed directly on the copper layer (706).

Figure 8:
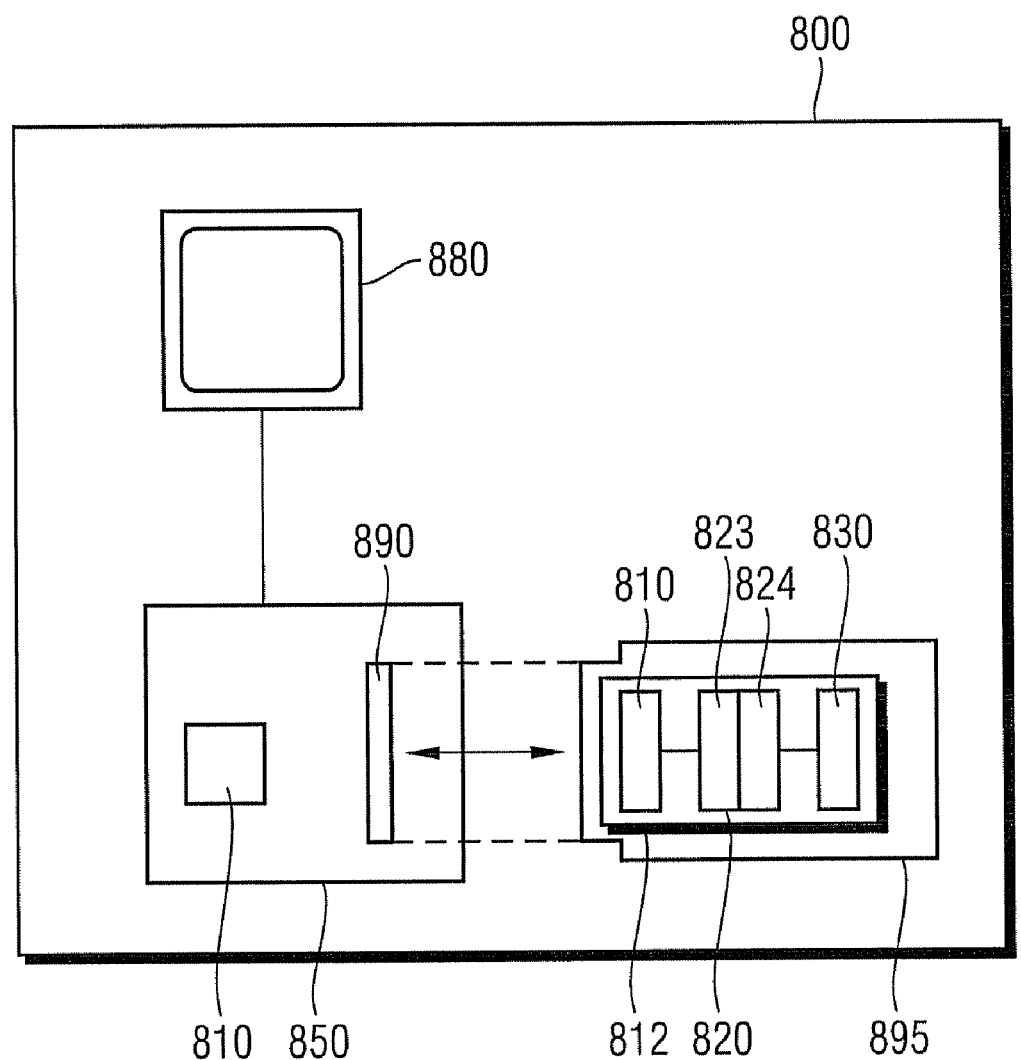
FIG. 8 illustrates a simplified block diagram of an electronic system including an integrated circuit according to one embodiment.

FIG. 8 schematically illustrates an electronic system 800 including a processor device 810 and an integrated circuit 812 that includes a rectifier element 820 based on cuprous oxide. The electronic system 800 may include an electronic sub-assembly 895 configured to be contacted at an interface and an interface 890 configured to electrically contact the electronic sub-assembly 895. The interface 890 may be a socket or a connector, by way of example. The integrated circuit 812 may be an interface circuit, a controller chip, a logic chip, or a memory chip mounted on the electronic sub-assembly 895. In accordance with other embodiments, the integrated circuit 812 is mounted on the same carrier as the processor device 810.

The integrated circuit 812 includes the rectifier element 820, a signal source 810 and an electronic circuit 830. The rectifier element 822, for example a diode, includes a copper layer 823 and a cuprous oxide layer 824 adjacent to and in direct contact with the copper layer 823. The signal source 810 is configured to drive a signal on a signal output terminal electrically coupled to the copper layer 823. The electronic circuit 830 is electrically coupled to the cuprous oxide layer 824. According to an embodiment, the signal source 810 supplies a supply voltage to the electronic circuit 830 via the rectifier element 820.

The processor device 810 may be mounted on a further sub-assembly or on a mother board 850 of the electronic system 800. The processor device 810 may be configured to process data received and/or transmitted from or via the electronic sub-assembly 895. The electronic system 800 may include further components, for example a display 880 for displaying data.

The electronic system 800 may be a computer, for example, a personal computer or a notebook, a server, a router, a game console, for example a video game console or a portable video game console, a graphic card, a personal digital assistant, a digital camera, a cell phone, an audio system, a video system, a memory system such as a USB stick or a solid state drive or a sub-system of a radio frequency identification system, by way of example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a rectifier element comprising a copper layer and a cuprous oxide layer adjacent to and in direct contact with the copper layer;
a signal source configured to drive a signal on a signal output terminal electrically coupled to the copper layer; and
an electronic circuit electrically coupled to the cuprous oxide layer.

2. The integrated circuit of claim 1, comprising wherein the signal source is an antenna element configured to receive a radio frequency.

3. The integrated circuit of claim 2, wherein the electronic circuit comprises a logic circuit.

4. The integrated circuit of claim 3, wherein the electronic circuit is configured to be supplied through a supply voltage induced by the radio frequency and rectified through the rectifier element.

5. The integrated circuit of claim 1, further comprising:
a further rectifier element comprising a further copper layer and a further cuprous oxide layer adjacent to and in direct contact with the further copper layer and electrically coupled to the cuprous oxide layer; and
a further signal source configured to drive a further signal on a further signal output terminal electrically coupled to the further copper layer;
wherein at least one of the signal sources is a switchable voltage source such that the electronic circuit is configured to be supplied through the signal source with the higher one of the supply voltages respectively.

6. The integrated circuit of claim 5, wherein the electronic circuit comprises electrically erasable non-volatile memory cells.

7. The integrated circuit of claim 1, comprising wherein the signal source is a DC-voltage source configured to supply a primary voltage.

8. The integrated circuit of claim 7, further comprising:
a further rectifier element comprising a further copper layer and a further cuprous oxide layer adjacent to and in direct contact with the further copper layer
a first capacitor electrically coupling the cuprous oxide layer and the further copper layer to a first pulsed signal; and
a second capacitor electrically coupling the further cuprous oxide layer to a second pulsed signal, where the first and second pulsed signals are controlled to generate a secondary voltage over the second capacity greater than the primary voltage.

9. The integrated circuit of claim 1, further comprising:
a further rectifier element comprising a further copper layer and a further cuprous oxide layer adjacent to and in direct contact with the further copper layer and electrically coupled to the cuprous oxide layer and a gate terminal of a field effect transistor; and
a further signal source configured to drive a further signal on a further signal output terminal electrically coupled to the further copper layer.

10. The integrated circuit of claim 1, further comprising:
a protective liner formed on the cuprous oxide layer, the protective line and the copper layer formed on opposing sides of the cuprous oxide layer.

11. An integrated circuit comprising
a first and a second rectifier element, each rectifier element comprising a copper layer and a cuprous oxide layer in direct contact with the respective copper layer;
a first signal source electrically connected with the copper layer of the first rectifier element;
a second signal source electrically connected with the copper layer of the second rectifier element; and
an electronic circuit electrically coupled to the cuprous oxide layer of the first and second rectifier elements.

12. The integrated circuit of claim 11, comprising wherein the first and second signal sources are configured to supply different output voltages at different times.

13. The integrated circuit of claim 11, comprising wherein the first and second signal sources are configured to drive binary logic signals and the electronic circuit comprises a field effect transistor, a gate terminal of which is electrically coupled to the second terminals of the rectifier elements.

14. A radio frequency tag comprising:
an antenna element configured to receive a radio frequency; and
a rectifier element electrically coupled to the antenna element and comprising a copper layer and a cuprous oxide layer adjacent to and in direct contact with the copper layer, wherein the copper layer is electrically coupled to the antenna element.

15. The radio frequency tag of claim 14 further comprising:
an electronic circuit electrically coupled to the cuprous oxide layer.

16. The radio frequency tag of claim 15, wherein the electronic circuit comprises a modulator and a demodulator circuit electrically coupled to the antenna element respectively.

17. An integrated circuit comprising:
a charge pump that comprises
a plurality of serial connected rectifier elements between an input terminal and an output terminal, wherein each rectifier element comprises a copper layer and a cuprous oxide layer adjacent to and in direct contact with the copper layer respectively; and
first and second capacitors, wherein the first and second capacitors are coupled the network nodes between two of the serial connected diodes in alternating order.

18. The integrated circuit of claim 17, wherein the first capacitors are connected to a first pulse generator and the second capacitors are electrically coupled to a second pulse generator.

19. The integrated circuit of claim 17, further comprising:
electrically erasable read only memory cells.

20. A method of manufacturing an integrated circuit, the method comprising:
forming a copper structure;
activating the copper structure
exposing the activated copper structure to hydrogen peroxide to form a cuprous oxide layer on the copper structure; and
forming a patterned hard mask above the copper structure before activating the copper structure, wherein the cuprous oxide layer is formed in uncovered portions of the copper structure.

21. a method of manufacturing an integrated circuit, the method comprising:
forming a copper structure;
activating the copper structure;
exposing the activated copper structure to hydrogen peroxide to form a cuprous oxide layer on the copper structure;
forming a patterned hard mask above the cuprous oxide layer; and
etching the cuprous oxide layer using the hard mask as an etch mask.

22. An electronic device comprising:
a processor device; and
an integrated circuit comprising:
a rectifier element comprising a copper layer and a cuprous oxide layer adjacent to and in direct contact with the copper layer,
a signal source configured to drive a signal on a signal output terminal electrically coupled to the copper layer, and
an electronic circuit electrically coupled to the cuprous oxide layer.

* * * * *